United States Patent [19]

Deam et al.

[11] Patent Number: 5,579,217
[45] Date of Patent: *Nov. 26, 1996

[54] LAMINATED BUS ASSEMBLY AND COUPLING APPARATUS FOR A HIGH POWER ELECTRICAL SWITCHING CONVERTER

[75] Inventors: David Deam, San Ramon; William L. Erdman, Brentwood, both of Calif.

[73] Assignee: Kenetech Windpower, Inc., Livermore, Calif.

[ * ] Notice: The term of this patent shall not extend beyond the expiration date of Pat. No. 5,365,424.

[21] Appl. No.: 339,551

[22] Filed: Nov. 15, 1994

Related U.S. Application Data

[63] Continuation-in-part of Ser. No. 990,681, Dec. 15, 1992, Pat. No. 5,365,424, which is a continuation-in-part of Ser. No. 728,112, Jul. 10, 1991, Pat. No. 5,172,310.

[51] Int. Cl.$^6$ .............................. H02M 1/10; H01B 5/00
[52] U.S. Cl. .......................... 363/144; 363/132; 361/611; 174/72 B; 307/148
[58] Field of Search .............................. 363/56, 132, 137, 363/141, 144; 361/335, 341, 361; 307/58, 147, 148; 174/72 B, 68.2, 99 B, 129 B, 133 B, 158 R, 163 R, 166 R, 193, 202; 257/719, 727

[56] References Cited

U.S. PATENT DOCUMENTS

| | | | |
|---|---|---|---|
| 3,895,285 | 7/1975 | Bardahl et al. | 321/8 C |
| 4,056,767 | 11/1977 | Tobise et al. | 363/141 |
| 4,224,663 | 9/1980 | Maise et al. | 363/141 |
| 4,346,257 | 8/1982 | Moss et al. | 361/306 |
| 4,458,305 | 7/1984 | Buckle et al. | 363/141 |
| 4,703,189 | 10/1987 | DiValentin et al. | 290/44 |
| 4,891,744 | 1/1990 | Yamamoto et al. | 363/89 |
| 4,907,068 | 3/1990 | Amann et al. | 357/74 |
| 5,132,896 | 7/1992 | Nishizawa et al. | 363/144 |
| 5,172,310 | 12/1992 | Deam et al. | 363/144 |
| 5,187,427 | 2/1993 | Erdman | 323/207 |
| 5,365,424 | 11/1994 | Deam et al. | 363/144 |

FOREIGN PATENT DOCUMENTS

| | | |
|---|---|---|
| 0072598 | 2/1983 | European Pat. Off. . |
| 0427143 | 11/1990 | European Pat. Off. . |
| 148696 | 1/1980 | Germany . |
| 3609065 | 8/1986 | Germany . |
| 61-237461 | 10/1986 | Japan . |
| 1160373 | 6/1989 | Japan . |
| 1283065 | 11/1989 | Japan . |
| 3065065 | 3/1991 | Japan . |

OTHER PUBLICATIONS

Hinrichsen, E. N., "Variable Speed for Wind Turbines: Objectives and Issues", AP–4261, Research Project 1996–9, Final Report, Sep. 1985, Research Reports Center, Palo Alto, California.

Intellimod™: Technical Data Book for Intelligent Power Modules, *Powerex, Inc., Hillis Street, Youngwood, Pennsylvania*, 1992, pp. 3–xiv to 3–xv.

(List continued on next page.)

*Primary Examiner*—Peter S. Wong
*Assistant Examiner*—Adolf Berhane
*Attorney, Agent, or Firm*—Blakely, Sokoloff, Taylor & Zafman

[57] ABSTRACT

A laminated bus assembly including a high power coupler to provide a low impedance, low noise laminated bus assembly for a switched converter that includes a plurality of switch pairs to convert between an AC power line and a DC device. The laminated bus assembly includes a first conductive layer, a second conductive layer, and a third conductive layer. A dielectric layer is laminated between each of the first, second, and third planes. The high power coupler includes a bushing positioned within the laminated assembly, including an engageable section for engaging with one of the conductive layers. A passage hole including an insulator ring is formed in intermediate conductive planes for passage of the bushing. A circuit layout includes a plurality of electrical connections between the switches, the AC, –DC and +DC bar conductors, and the DC device.

7 Claims, 11 Drawing Sheets

OTHER PUBLICATIONS

McNerney et al., "The Effect of a Power Electronic Converter on Power Fluctuation and Harmonic Distortion in a WECS", ASME Wind Energy Symposium, New Orleans, Jan. 1990.

Matsuzaka et al., "A Variable Speed Wind Generating System and its Test Results, Hachinohe Institute of Technology", Tohoku Electric Power Company, Japan.

Ott, Henry, W., "Noise Reduction Techniques in Electronic Systems", 2nd Edition, *John Wiley & Sons* (1988), pp. 124–126.

Rashid Muhammad, *Power Electronics,* Chapter 8, "Inverters", pp. 226–248.

Smith et al., "A Variable–Speed Constant–Frequency Induction Generator for Sub and Supersynchronous Operation", European Wind Energy Association Conference and Exhibition, Oct. 7–9, 1986, Rome, Italy.

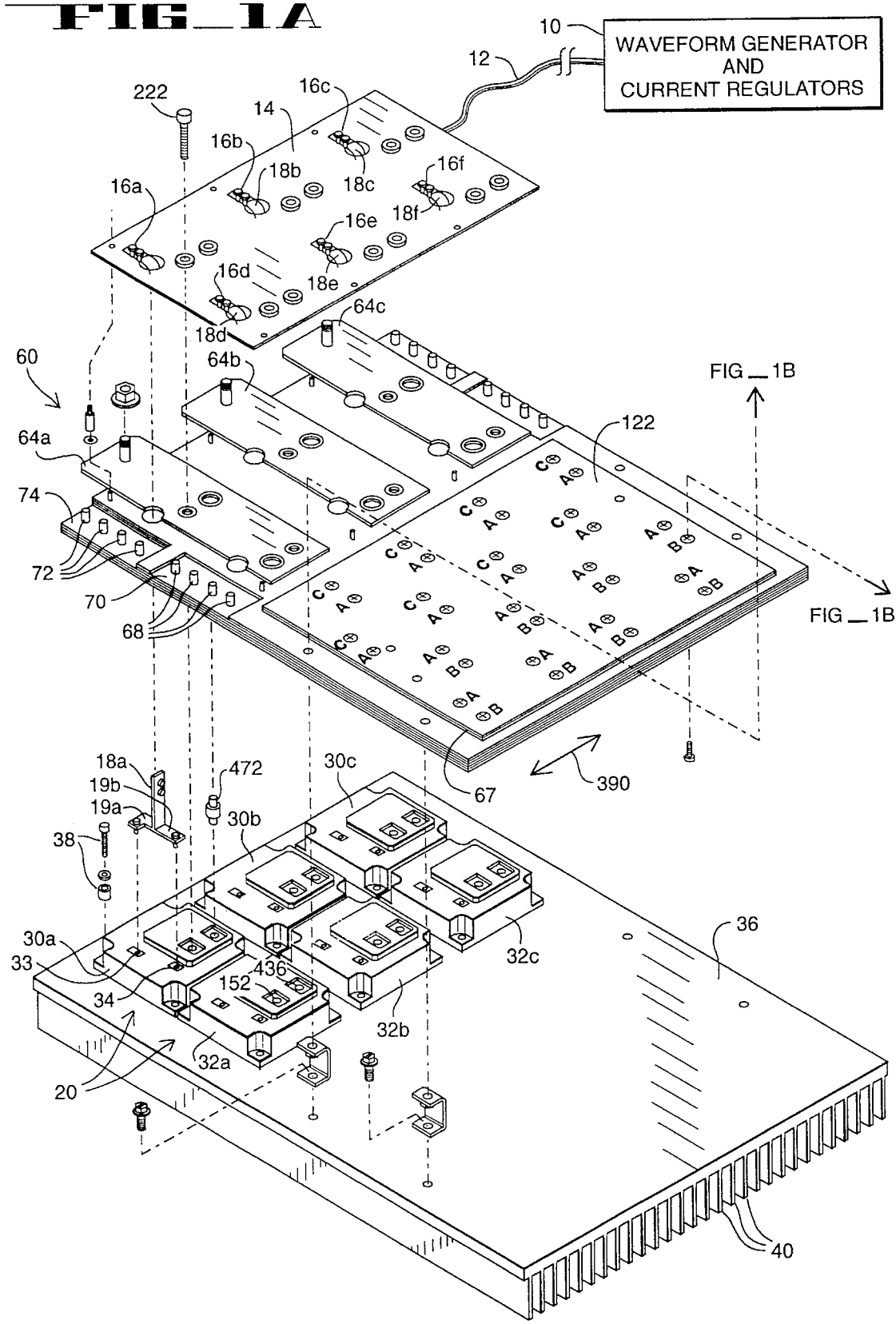

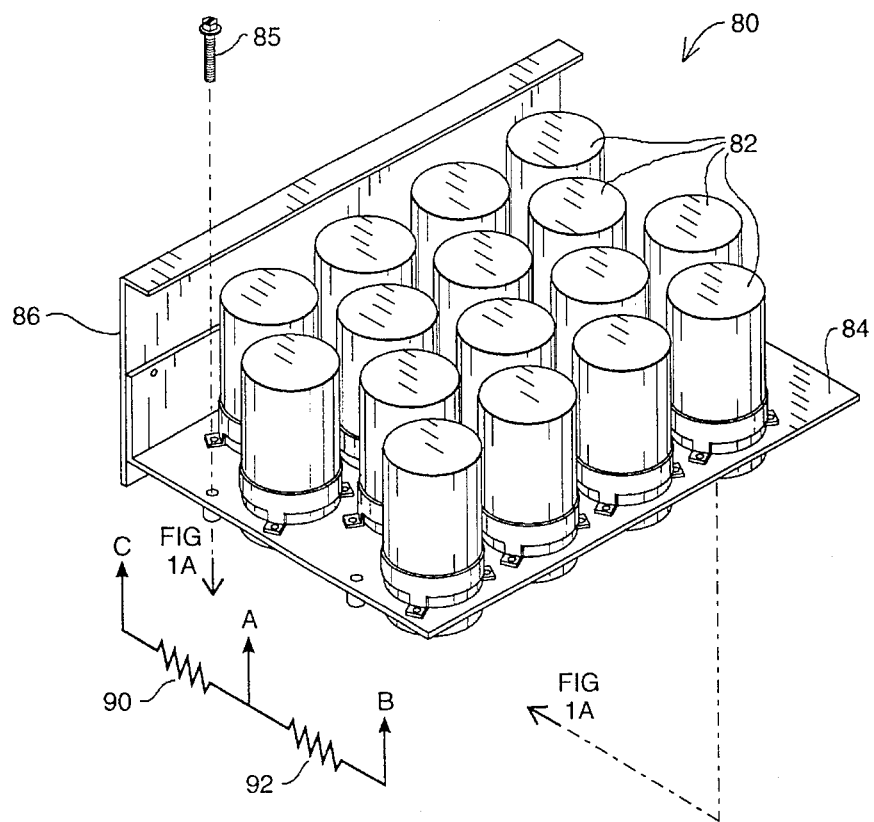
FIG_1B
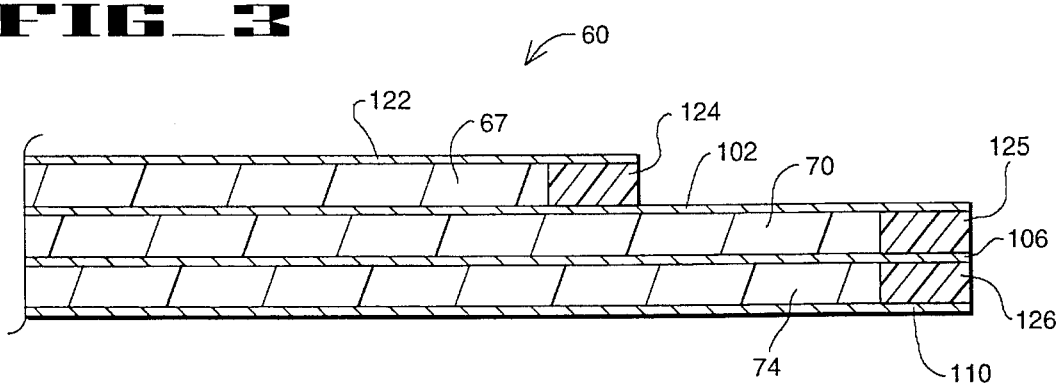
FIG_3

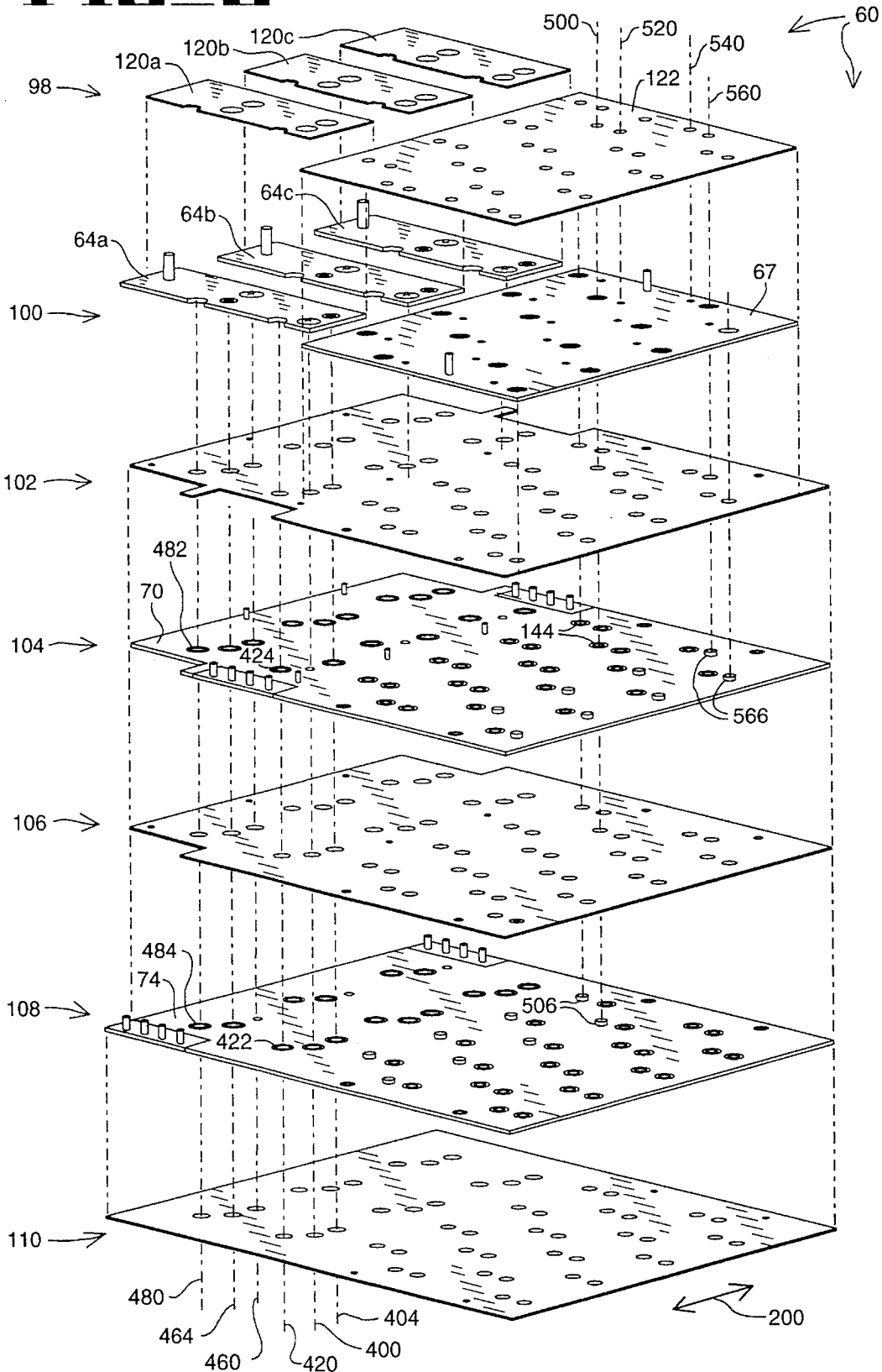
FIG_2

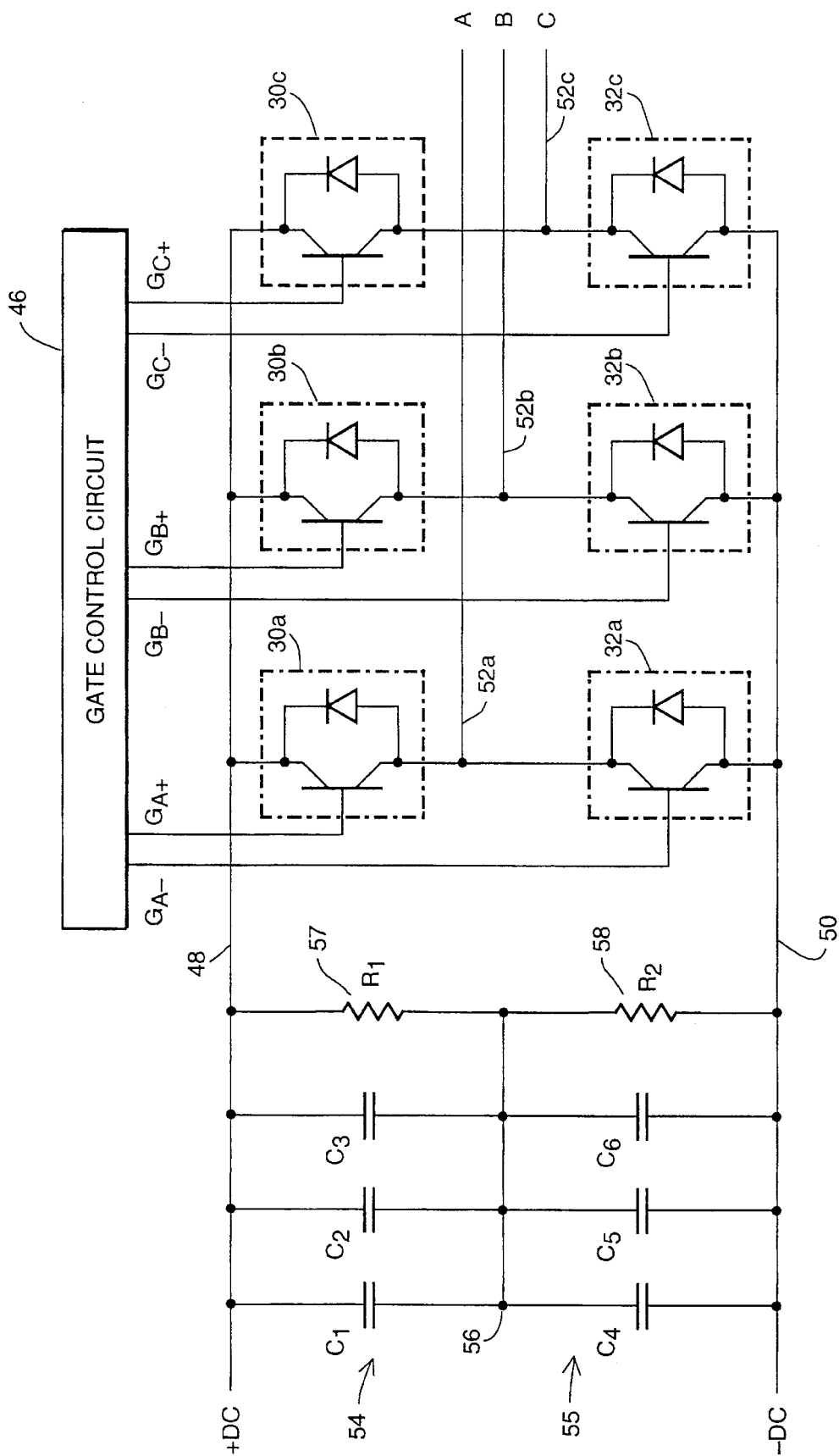
FIG_4

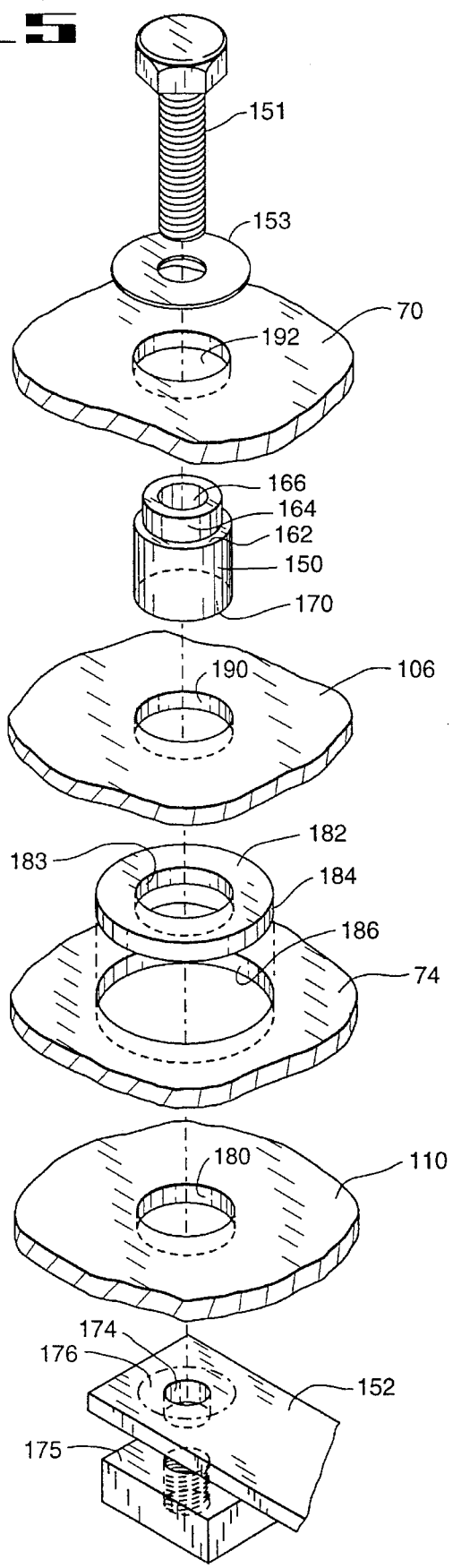

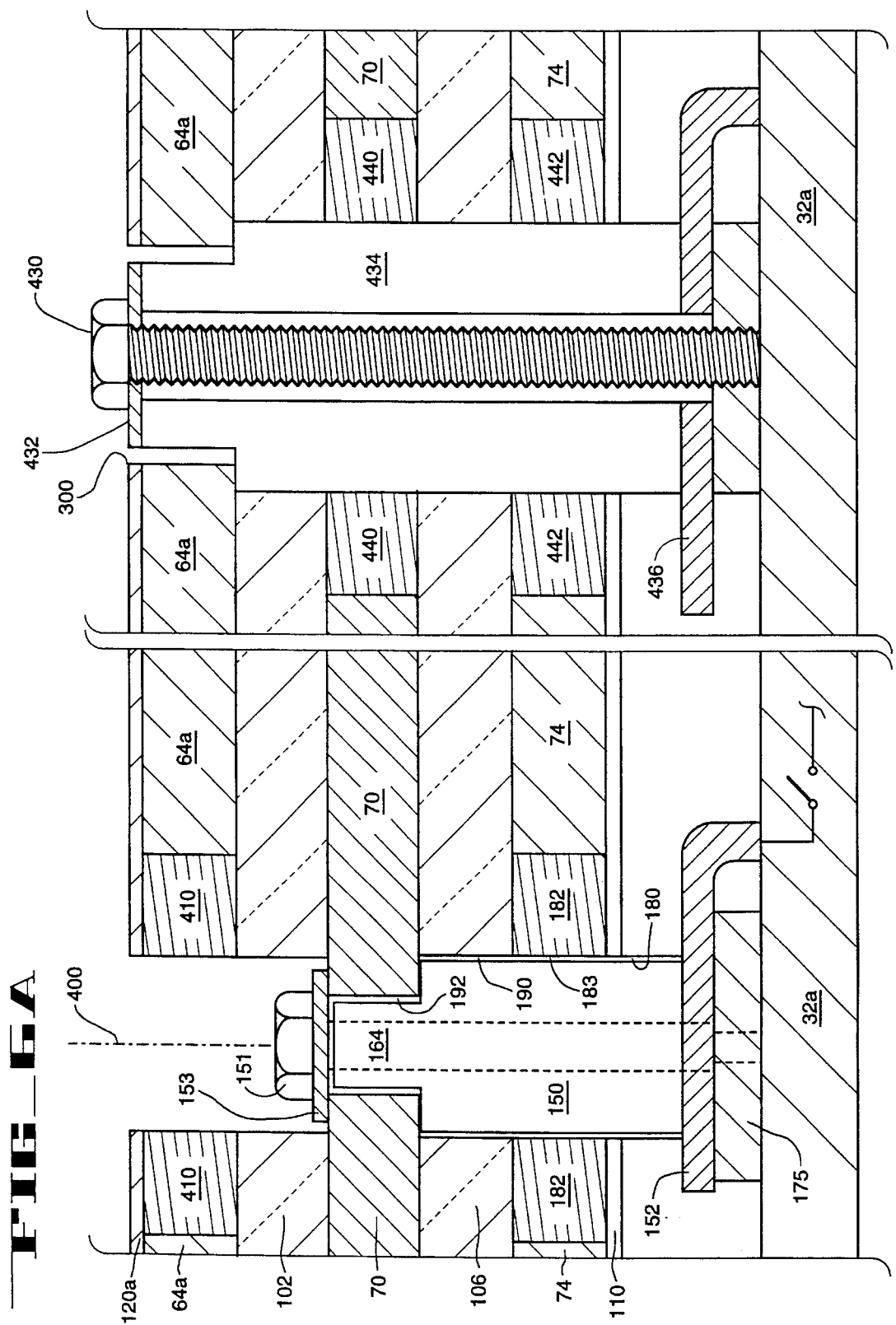

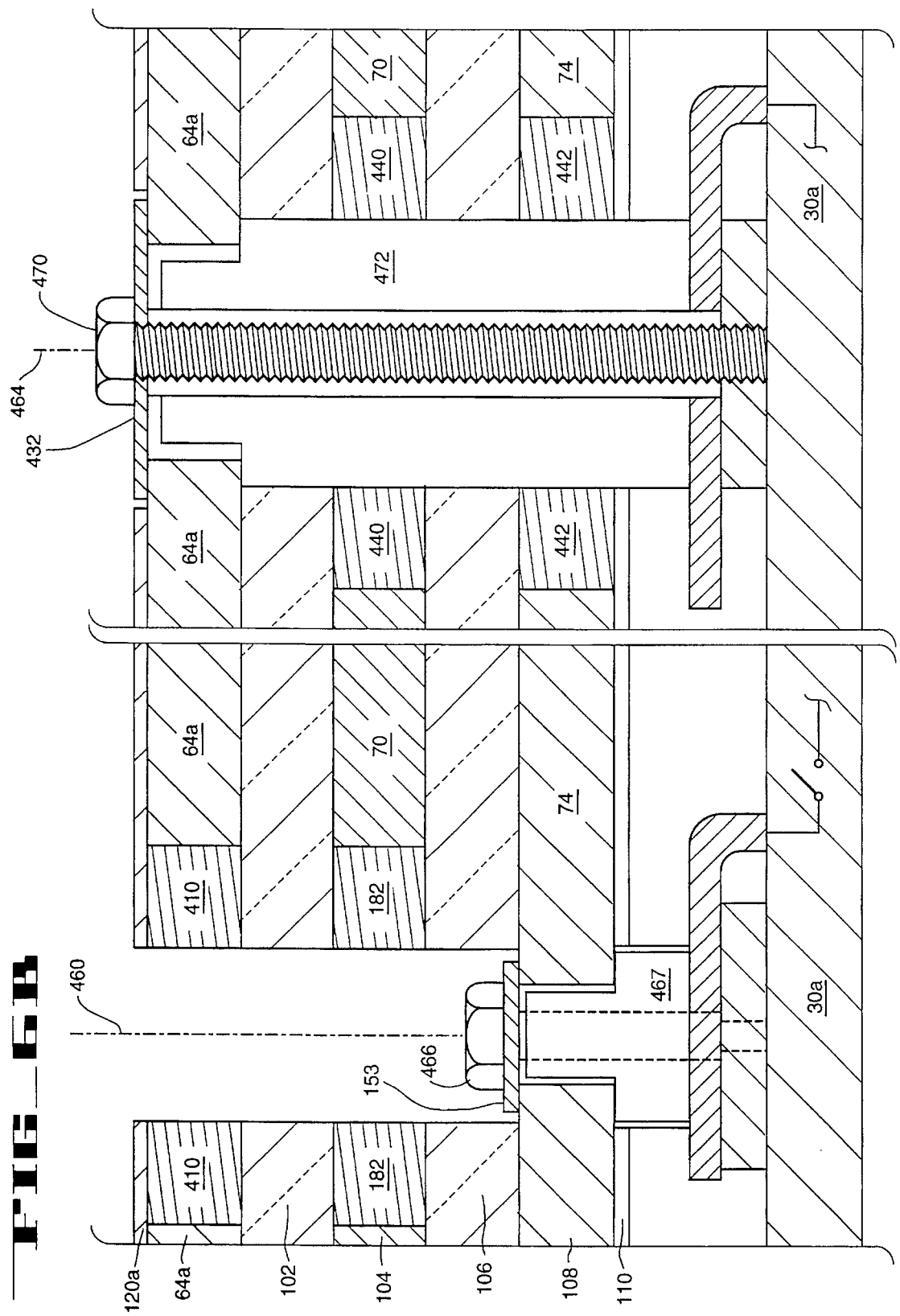

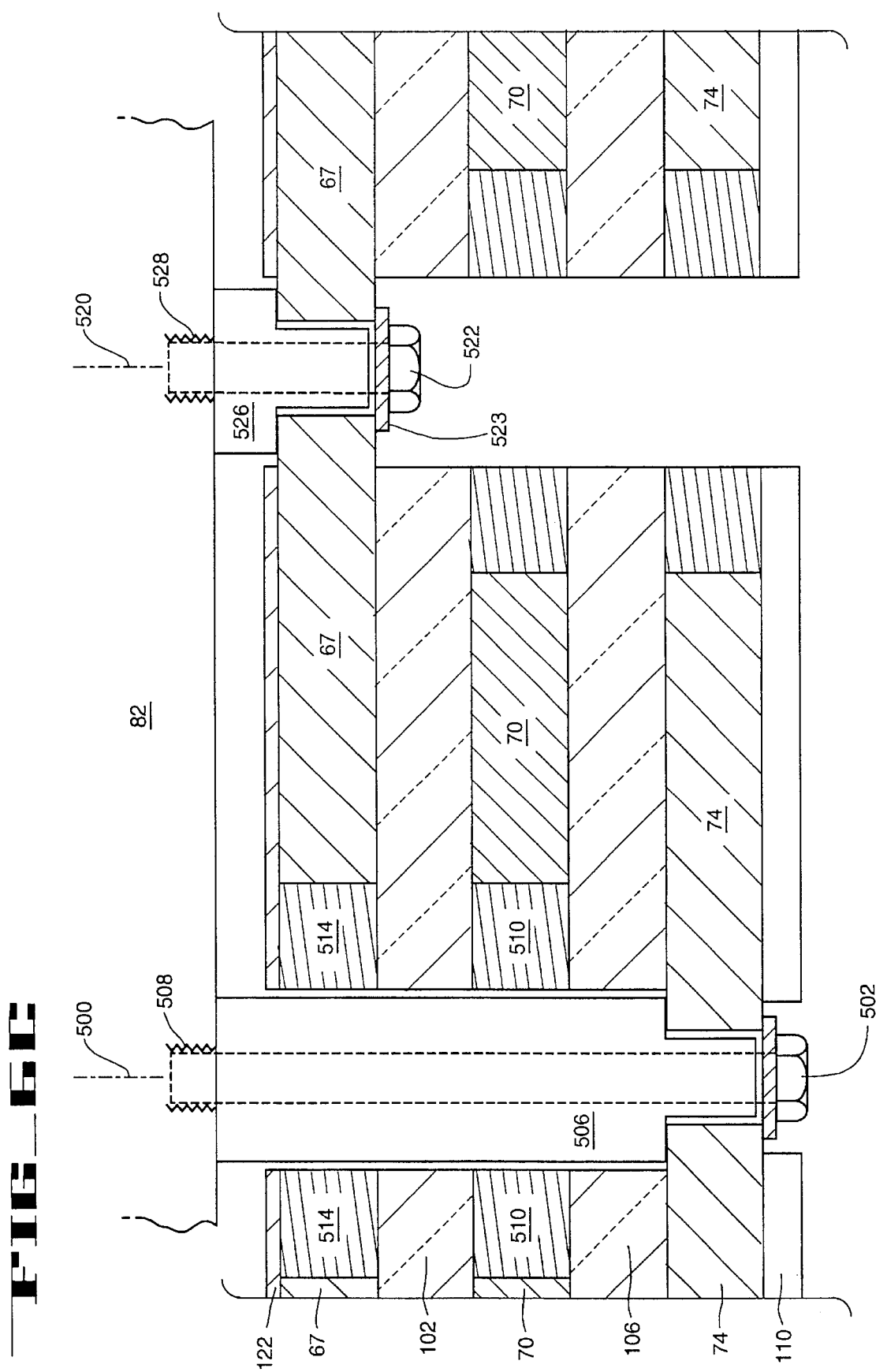

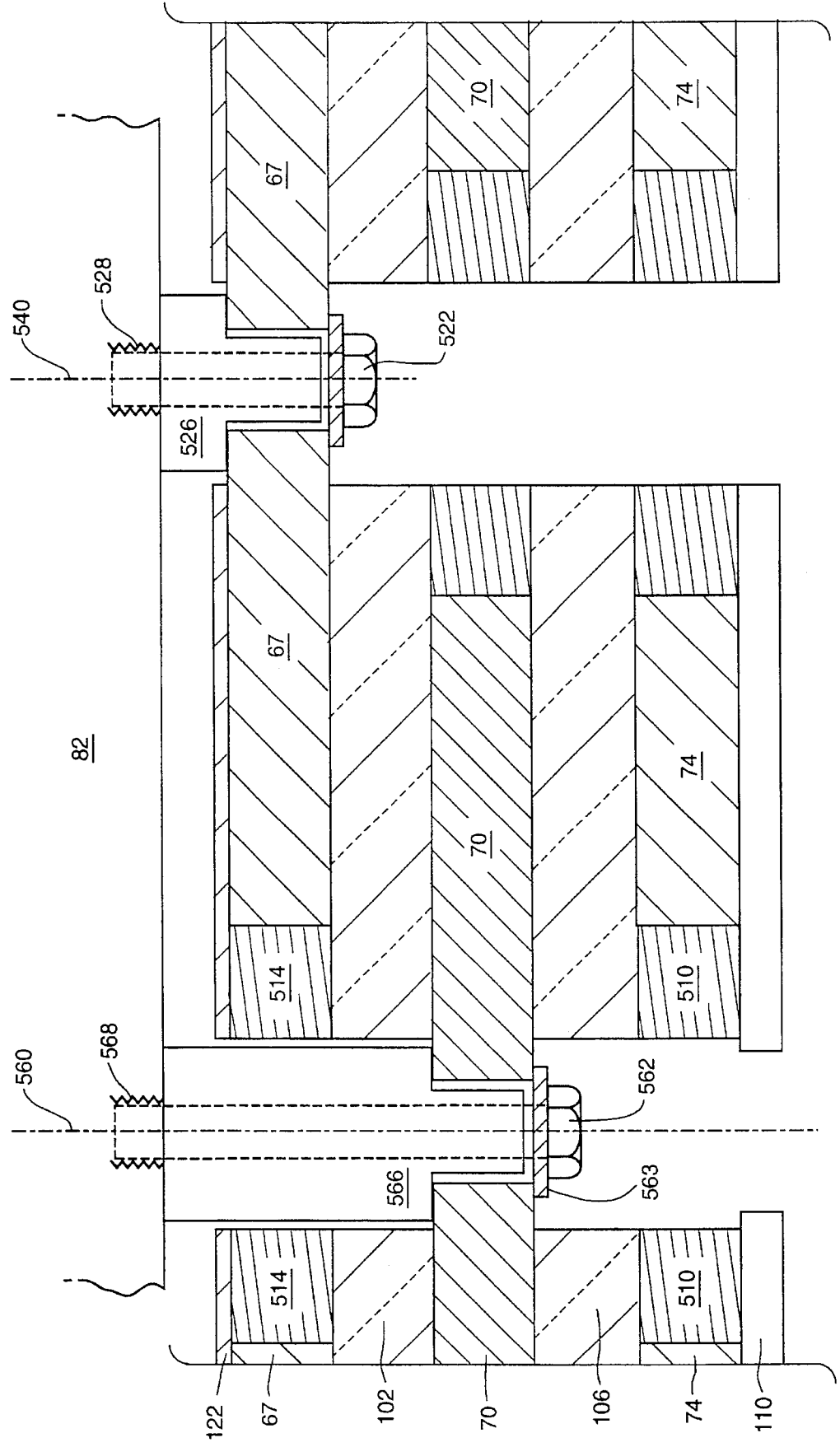

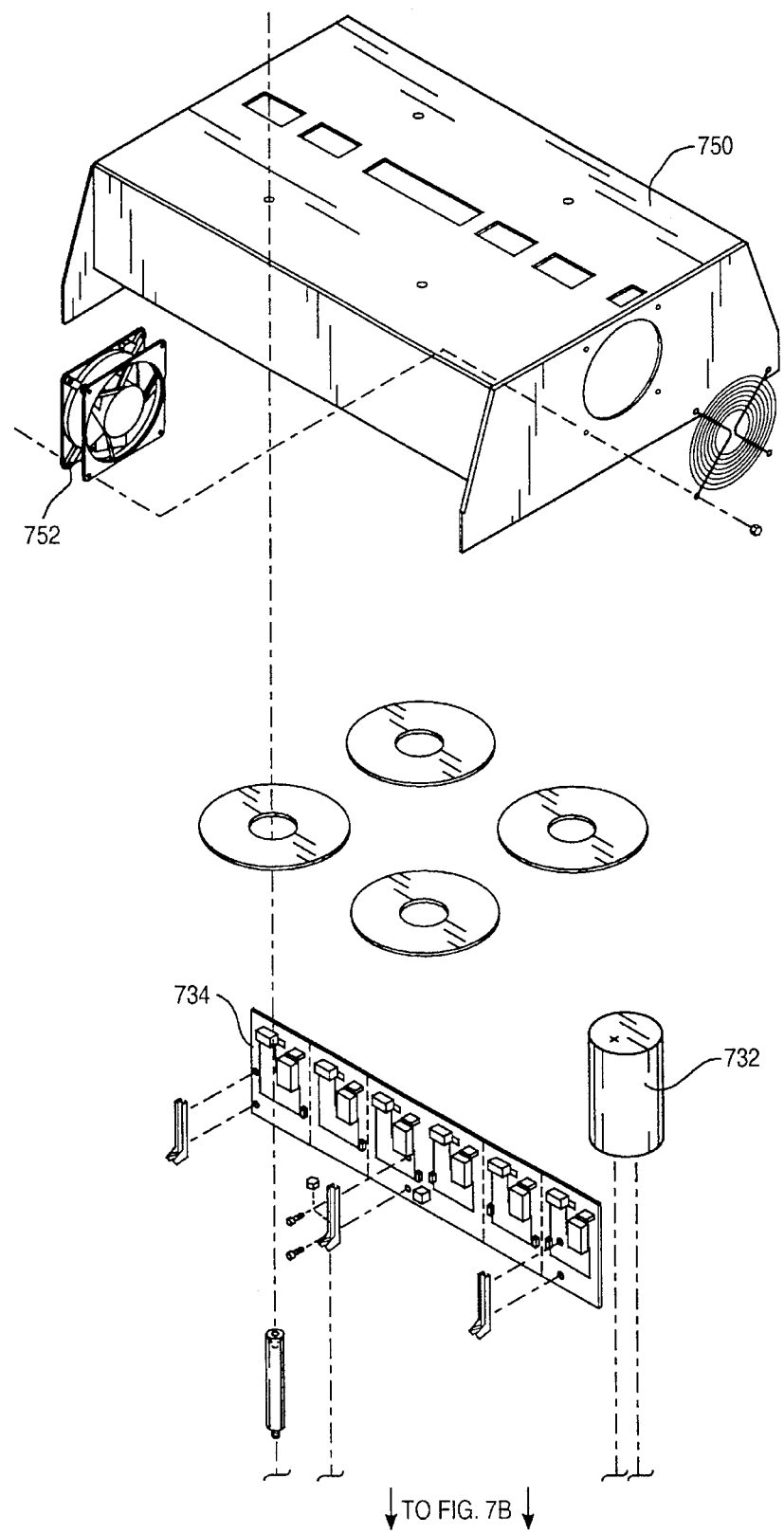
FIG_7A

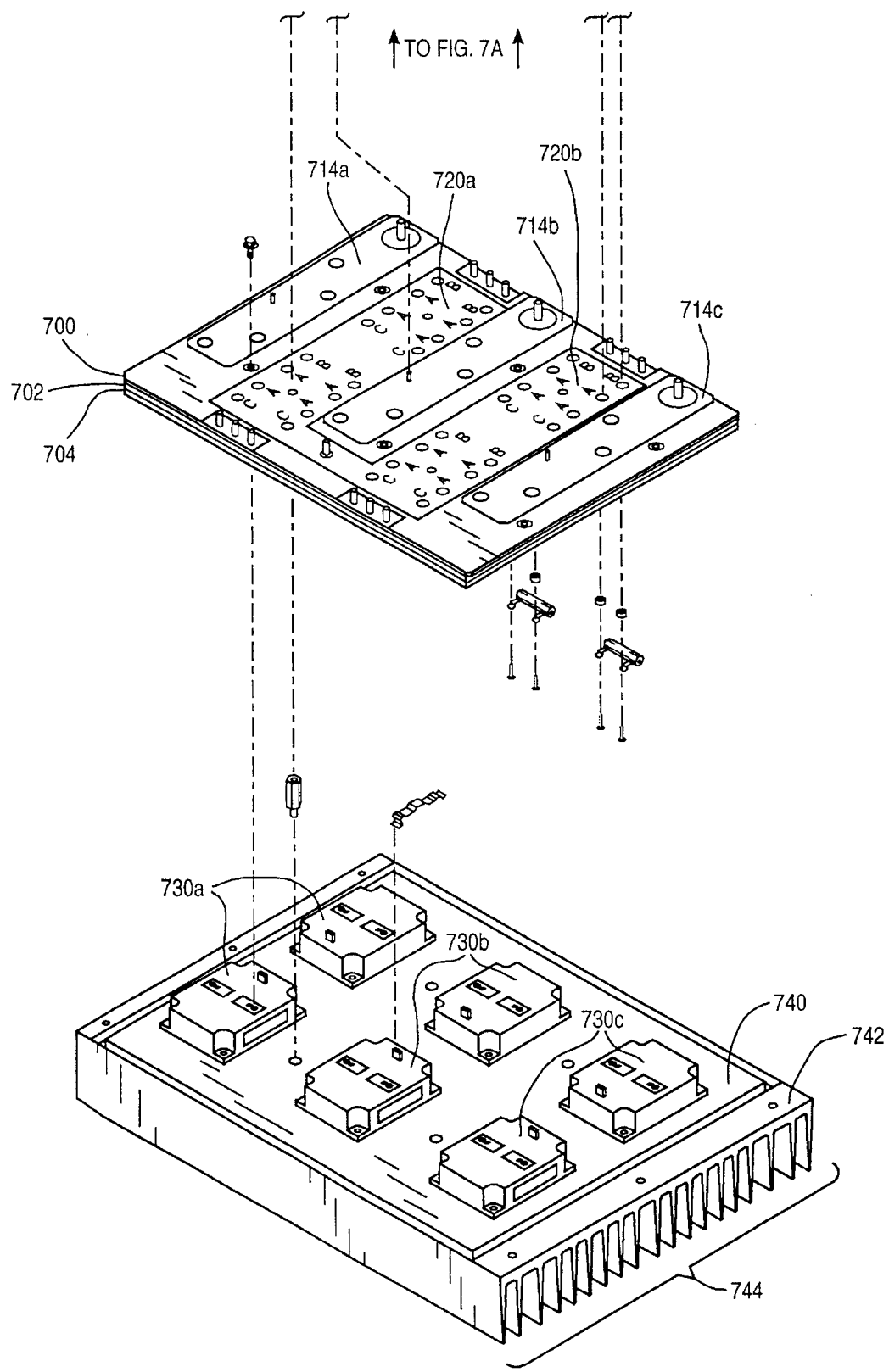
FIG_7B

LAMINATED BUS ASSEMBLY AND COUPLING APPARATUS FOR A HIGH POWER ELECTRICAL SWITCHING CONVERTER

CONTINUATION DATA

This is a continuation-in-part of U.S. patent application, Ser. No. 07/990,681, "High Power Laminated Bus Assembly for an Electrical Switching Converter", by Erdman, et al., filed Dec. 15, 1992, now U.S. Pat. No. 5,365,424, issued Nov. 15, 1994, which is incorporated by reference herein, which is a continuation-in-part of U.S. patent application Ser. No. 07/728,112, "Low Impedance Bus for Power Electronics", by Deam, et al., filed Jul. 10, 1991, now U.S. Pat. No. 5,172,310, which is incorporated by reference herein.

BACKGROUND OF THE INVENTION

1. Field of the Invention

The present invention relates to high power bus assemblies for converters with high speed switches that are modulated to convert electrical power from AC to DC, or from DC to AC.

2. Description of Related Art

There are many instances in which conversion between AC electrical energy and DC electrical energy is useful. For example, U.S. Pat. No. 5,083,039 to Richardson, et al., describes a variable speed wind turbine that utilizes a converter to convert the generated variable frequency AC power to DC power. A second converter then converts this DC power back to fixed frequency AC power that is compatible with the power grid. The converters described therein are switching converters that include a plurality of high speed switches controlled by pulse width modulation techniques to provide either a current-controlled waveform or a voltage-controlled waveform.

High modulation speeds allow greater control of the predetermined waveform; however, modulation speeds are limited by the impedances of the input buses and the output buses. Particularly, an inductive bus impedance substantially attenuates the high frequency bus response at high frequencies, resulting in slower effective switching speed, reduced conversion efficiency, and less accurate waveform control. Another problem related to an inductive impedance is the possibility of damage to the semiconductor devices caused by voltage transients during high speed switching. By reducing the characteristic impedance of the bus, voltage transients can be lowered, thus reducing the potential for damage to the semiconductor devices and increasing their expected lifetime.

To reduce impedance at high (microwave) frequencies, parallel plate transmission lines have been used extensively. For low power electrical circuits, space and cost savings have been realized by using laminated circuits that have a stack of conductive layers alternating with dielectric layers.

High power electrical circuits have power transfer requirements that make implementation with laminated circuits difficult. Particularly, high power conductors require a large conductive cross-section, which requires that the conductors have much greater thicknesses. Furthermore, to avoid arcing, closely positioned high voltage conductors must be well insulated from each other. Arcing is a particular problem when connecting conductors that are in different layers, particularly if the connector passes through another conductive layer.

It would be an advantage to supply a coupler for coupling between layers of a high power laminated bus with low impedance in a compact, robust package that is mechanically strong and can safely and efficiently conduct large current at high voltages.

SUMMARY OF THE INVENTION

The present invention provides a laminated bus assembly and a high power coupler for coupling external components to selected layers within the laminated bus assembly that conducts large currents at high voltages. The coupler is mechanically strong and electrically well insulated, thereby providing reliable operation over long time periods. The high power coupler is useful to electrically couple an external device such as a switch or capacitor to a selected conductive layer within the laminated bus assembly. Because each coupler provides a mechanically strong connection between the external component and the laminated bus assembly, a plurality of external components can be electrically coupled to selected layers within the laminated bus assembly in a mechanically sound manner.

The high power coupler can provide bus connections between a laminated bus and a high power converter that converts electrical energy between multi-phase AC and constant voltage DC. A bushing is press fit into a hole in each of the bar conductors to which it is electrically coupled, to provide a close fit and a strong electrical connection for carrying high currents. To pass through other conductive layers positioned intermediate between the coupled conductors, an insulation ring is positioned tightly between the bushing and the intermediate conductive layer so that current cannot jump the gap between the bushing and the intermediate conductive layer, thereby electrically isolating the intermediate conductive layer from the bushing passing therethrough.

The converter includes a DC device such as a capacitor bank for storing electrical energy at a constant voltage. A switch pair is coupled between each AC phase and the capacitor bank. The converter also includes a switch controller coupled to the switch pairs for controlling the switch pairs to provide a predetermined electrical power flow in direction and amount. The switch controller utilizes pulse width modulation (PWM) techniques to control the instantaneous currents in the switches.

The low characteristic impedance of the laminated bus assembly allows high switching speeds for the converter, high conversion efficiency, and a highly accurate output waveform. Furthermore, the low characteristic impedance reduces voltage transients caused by fast transitioning currents, providing reliable operation with semiconductor switches having a lower voltage rating than would otherwise be possible.

The laminated bus assembly provides a structure that is mechanically strong, durable, and reliable. It can withstand vibration and shock, and even provides good electrical connections in the presence of moisture. It is particularly useful in wind turbines that, once installed in a remote location, can be expensive to repair. The laminated bus assembly can support heavy loads: it has been implemented to support loads including the capacitor bank and heavy high power cables.

BRIEF DESCRIPTION OF THE DRAWINGS

FIGS. 1A and 1B are perspective views of a gate control board, a laminated bus assembly, a switch pad, and a capacitor bank that are assembled to provide a converter.

FIG. 2 is an exploded view of the laminated bus assembly.

FIG. 3 is a cross-sectional view of edge fill in the laminated bus assembly.

FIG. 4 is a schematic diagram of a switching converter, illustrating the switch pairs, the capacitor bank, the voltage splitting resistors, the gate control circuit, and the buses.

FIG. 5 is an exploded view of an electrical coupling between the −DC bar conductor and the +DC switch through the +DC bar conductor and two dielectric layers.

FIG. 6A is a cross-sectional view of an electrical coupling from the −DC bar conductor, through intermediate conductor layers and dielectric layers, through the −DC switch, through intermediate conductor layers and dielectric layers, and to the first AC bar conductor.

FIG. 6B is a cross-sectional view of an electrical coupling from the +DC bar conductor, through intermediate dielectric and conductor layers, through the +DC switch, through intermediate dielectric and conductor layers, and to the first AC bar conductor.

FIG. 6C is a cross-sectional view of the coupling to one capacitor, including a coupling from the −DC bar conductor to the capacitor and a coupling from the midpoint bus to the capacitor.

FIG. 6D is a cross-sectional view of an electrical coupling to a second capacitor, including a coupling between the +DC bar conductor and the capacitor, and a coupling between the midpoint bus and the second capacitor.

FIGS. 7A and 7B together show a perspective view of an alternative embodiment including a cooling fan and a layout in which the switches are positioned apart for better heat dissipation.

DETAILED DESCRIPTION OF THE PREFERRED EMBODIMENT

FIGS. 1A through 7B of the drawings disclose various embodiments of the present invention for purposes of illustration only. One skilled in the art will readily recognize from the following discussion that alternative embodiments of the structures and methods illustrated herein may be employed without departing from the principles of the invention.

Reference is first made to FIG. 1A which shows an exploded view of a converter including a laminated bus assembly 60. In a box 10, a waveform generator and current regulators are illustrated. Within the box 10, conventional computer equipment produces control signals for the converter in accordance with conventional pulse width modulation (PWM) techniques. The signals from the waveform generator and current regulators 10 are applied through a fiber optic cable 12 to a gate control board 14. The gate control board 14 includes conventional circuitry to convert these fiber optic signals to electrical control signals. These electrical signals are applied from a plurality of control outputs 16a–f to a plurality of gate buses 18a–f, one for each of the six control outputs 16a–f.

For purposes of illustration, a perspective view of the gate bus 18a is provided, illustrated and connected to the control output 16a. It should be apparent that the gate bus 18a is connectable to the control output 16a. Each of the gate buses 18a–f are similar to the construction of the illustrated gate bus 18a. Particularly, each gate bus 18a–f includes a microstrip transmission line having a first conductor 19a and a second conductor 19b with minimum spacing ("0.001") therebetween for high immunity to noise.

The plurality of gate buses 18a–f connect the control outputs 16a–f with a plurality of high speed switches illustrated generally at 20. The plurality of switches 20 include two groups: a plurality of +DC switches 30a–c and a plurality of −DC switches 32a–c. The plurality of gate buses 18a–f are coupled, respectively, to the switches 30a–c and 32a–c: the +DC switch 30a is coupled to the gate bus 18a, the +DC switch 30c is coupled to the gate +18b, the DC switch 30c is coupled to the gate bus 18c, the −DC switch 32a is coupled to the gate bus 18d, the −DC switch 32b is coupled to the gate bus 18e, and the −DC switch 32c is coupled to the gate bus 18f. The switches 30a–c and 32a–c comprise any of a plurality of fast semiconductor switches, including IGBTs, bipolar transistors, or MOSFETs. In the preferred embodiment IGBTs are utilized. The switches 30a–c and 32a–c are positioned on a switchpad 36 by appropriate connecting hardware such as illustrated at 38 by a screw, a washer, and a sleeve. The switchpad 36 comprises a heat conductive material and a plurality of heat fins 40 positioned on a surface of the switchpad 36 to cool the switches 30a–c and 32a–c. The heat fins 40 may be exposed to cooling fluids such as wind in order to more effectively cool the switches.

For purposes of illustration, coupling between the gate bus 18a and the switch 30a will be described. It should be apparent that coupling between the other gate buses 18b–f and their respective switches 30b–c and 32a–c is accomplished similarly. The gate bus 18a includes the first conductor 19a and the second conductor 19b, in a conventional microstrip configuration, as discussed above. The gate bus 18a is applied to control inputs on the +DC switch 30a. Particularly, the first conductor 19a is coupled to a gate 33 on the +DC switch 30a, and the second conductor 19b is coupled to a "K" connection 34, which is an absolute ground. In other embodiments, the number of conductors, and construction of the gate buses 18a–f may vary dependent upon the connections required by the switches that it controls. For example, in other embodiments a gate bus may comprise a cable with five conductors.

Reference is now made to the circuit diagram of FIG. 4 which is a schematic diagram of the circuit implemented in FIG. 1A. A gate control circuit 46 (which is implemented in the gate control board 14 in FIG. 1A) supplies signals to +DC switches 30a–c and −DC switches 32a–c, arranged in pairs between a +DC rail 48 and a −DC rail 50. Each pair has a phase output line coupled between the +DC switch and the −DC switch. Particularly, the first +DC switch 30a is coupled between the +DC rail 48 and a phase A output line 52a, the second +DC switch 30b is coupled between the +DC rail 48 and a phase B output line 52b, and the third +DC switch 30c is coupled between the +DC rail 48 and a phase C output line 52c. The first −DC switch 32a is coupled between the −DC rail 50 and the phase A output line 52a, the second −DC switch 32b is coupled between the −DC rail 50 and the phase B output line 52b, and the third −DC switch 32c is coupled between the −DC rail 50 and the phase C output line 52c.

A plurality of capacitors are also coupled between the +DC rail 48 and the −DC rail 50. The capacitors are grouped in rows including an upper row 54 including capacitors $C_1$, $C_2$ and $C_3$, and a lower row 55 including capacitors $C_4$, $C_5$, $C_6$. All capacitors in the upper row 54 are coupled in parallel, and likewise, all capacitors in the lower row 55 are coupled in parallel. The upper row 54 and the lower row 55 are coupled in series between the +DC rail 48 and the −DC rail 50. The series configuration of the capacitor rows 54 and 55 has cost advantages because the peak voltage rating of each of the capacitors can be less than the voltage across the +DC rail 48 and the −DC rail 50. Because the voltage peak is divided between two capacitors, low cost capacitors with relatively low maximum peak voltages can be used rather than expensive ones with a higher maximum voltage peak. Of course, other embodiments may have different voltage requirements, and in those embodiments the configuration and/or the number of capacitors could be modified accordingly.

Between the upper row 54 and the lower row 55, a midpoint voltage appears on a node 56. The voltage at the midpoint 56 is controlled by resistor 57 and 58. Because each of the capacitors $C_1$ through $C_6$ have an identical rating, it is useful if the resistors 57 and 58 also have a substantially identical value so that the voltage is divided evenly between the upper row 54 and the lower row 55.

Reference is now made to FIGS. 1A, FIG. 2, and FIG. 4. A laminated bus assembly 60 provides the bus connections to implement the circuit diagram illustrated in FIG. 4. The laminated bus assembly 60 includes a plurality of conductive layers alternating with dielectric layers to insulate them from each other. An upper conductive surface includes AC bar conductors 64a, 64b, and 64c, which respectively correspond to the output buses 52a, 52b, and 52c illustrated in FIG. 4. The laminated bus assembly 60 also includes a midpoint bus 67 which implements the intermediate node 56 between the capacitors $C_1$–$C_6$ shown in the circuit diagram of FIG. 4.

A plurality of −DC output studs 68 are provided on a −DC bar conductor 70 that extends through the laminated bus assembly 60. A plurality of +DC output studs 72 are provided on a +DC bar conductor 74 that extends through the laminated bus assembly 60. The −DC bar conductor 74 corresponds to the −DC rail 50, and the +DC bar conductor 74 corresponds to the +DC rail 48 shown in the circuit diagram of FIG. 4. The +DC output studs 72 and the −DC output studs 68 are useful for external connections. For example, the output studs 68 and 72 can be connected, via a DC link, to another converter in a dual-converter configuration that is useful for converting variable frequency AC power to DC, and then converting the DC power to constant frequency AC power suitable for power grids. The dual-converter configuration is useful for power conversion in variable speed wind turbines. Alternately, the output stud 68 and 72 can be connected to a storage source of DC electrical energy, such as a conventional storage battery.

Reference is now made to FIG. 1B which is a perspective view of a capacitor bank 80 that connects with the laminated bus assembly 60 in FIG. 1A. The capacitor bank 80 includes a plurality of electrolytic capacitors 82 which implement the capacitors $C_1$–$C_6$ in illustrated in FIG. 4 in the rows 54 and 56. The embodiment of FIG. 1B includes sixteen electrolytic capacitors 82, each having a maximum voltage rating of 450 volts. The capacitors 82 are arranged in eight pairs, each pair including two capacitors coupled in series so that the maximum voltage between the −DC bar conductor 70 and the +DC bar conductor 74 is the sum of the maximum voltage of the two capacitors (i.e., 2×450, or 900 volts in the preferred embodiment). Thus, the maximum voltage allowed between the conductors 70 and 74 is greater than the expected operating voltage, which is 750 V to 800 V.

The capacitors 82 are mounted upon a mounting plate 84 which is affixed to the laminated bus assembly 60 by conventional means such as a plurality of screws, one which is shown as a screw 85. To couple the capacitors 82 with a predetermined layer in the laminated bus assembly 60, a coupling system is used that is described for example with reference to FIGS. 6C–6D. An isolation plate 86 is positioned between the capacitors 82 and the AC bar conductors 64 in order to electrically isolate the capacitors from the AC bars 64 and eliminate arcing or interference. A resistor 90 illustrated in FIG. 1B is coupled between the connections marked "A" in FIG. 1A and those marked "C". The resistor 90 corresponds to the resistor 57 of FIG. 4. Furthermore, a resistor 92 is coupled between the "A" connection and the "B" connection of the midpoint bus 67 in FIG. 1A. The resistor 92 corresponds to the resistor 58 of FIG. 4. Preferably, the resistors 90, 92 have an equivalent value so that the voltage is divided approximately evenly.

Reference is again made to FIG. 2 which is an exploded view of a laminated bus assembly 60. The laminated bus assembly 60 includes a plurality of conductor layers alternating with dielectric layers. Beginning at the top of FIG. 2, and working down, a cover layer 98 includes a plurality of insulators such as plastic insulator pieces to protect the metal surfaces to be described. A first conductive layer 100 includes the three AC bar conductors 64a–c, and the midpoint bus 67. A next dielectric layer 102 is positioned between the conductive layer 100 and a −DC conductive plane 104. The −DC bus 70 occupies the entire conductive layer 104. A dielectric layer 106 is positioned between the −DC conductive layer and a +DC conductive layer 108 which includes the +DC bar conductor 74. A lower plastic insulator layer 110 is affixed on the underside of the +DC conductive layer 108 in order to isolate it from the switches 20 and the switchpad 36.

The layer 98 includes a plastic insulator piece 120a formed to cover the AC bar conductor 64a. Similarly, plastic insulator pieces 120b and 120c have a shape to cover the AC bar conductor 64b and 64c. Likewise, a plastic insulator piece 122 has a shape to cover the midpoint bus 67.

Reference is now made to FIG. 2 and FIG. 3 to describe one implementation of the laminated bus assembly 60. The bar conductors 64a, 64b, 64c, 70, and 74 are formed from aluminum sheet metal having a thickness for high current densities. The thickness can be within the range of 0.05 and 0.12 inches, preferably 0.093 inch. Holes are punched therein to provide the layout disclosed in FIG. 2 and discussed later in more detail herein. The conductors are plated to prevent oxidation. The dielectric layers 102, 106, and 110 include a dielectric material such as "G-10" with a high dielectric constant. Another choice for the dielectric material is a polyimide material such as a Kapton™, which is available from Dupont Corporation. The thickness of the dielectric layers 102, 106, is smaller than that of the conductors, i.e., for example within the range of 0.005 and 0.030 inches in order to reduce the impedance at high voltages and power. The dielectric layers 102, 106 are positioned between the bar conductors 64a, 64b, 64c, 70 and 74 and are bonded thereto by any suitable adhesive. With reference to FIG. 3, the edges are filled with an epoxy fill 124, 125, 126 to avoid exposed metal surfaces. Furthermore, all exposed metal is plated to prevent oxidation. The resulting laminated bus assembly 60 is very rugged mechanically while maintaining advantageous electrical characteristics: low impedance, high current carrying ability, and isolation of high voltage components. The laminated bus assembly 60 can hold the substantial weight of the capacitors affixed to it, as well as any heavy electrical cables that may be attached to it. Even if the resins were to break down, the unit would still be electrically operable to some extent.

Each conductive and dielectric layer includes a plurality of holes having a predetermined shape and configuration for coupling conductive layers to electrical devices external to the laminated bus assembly, specifically to switches or capacitors.

The following discussion, with reference to FIG. 5, shows an exemplary coupling between a layer of the laminated bus assembly 60 and an electrical component external to the laminated bus assembly 60 for illustrative purposes. Specifically, FIG. 5 is a perspective view of a coupling between the first AC bar conductor 64a and the –DC switching device 32a. It will be apparent that the principles of the coupling mechanism are similar for each of several coupling configurations to be described. A subsequent discussion, with reference to FIGS. 2, 6A, 6B, 6C, and 6D describes the configuration of each of the other couplings.

Reference is now made to FIG. 5, which is an exploded view of a coupling that electrically couples the –DC layer 70 with a switch conductor 152 on the –DC switch 32a. The coupling includes a bushing 150 comprising an electrically conductive material, preferably plated with electrolytic nickel. A bolt 151 and a washer 153 positioned thereon affix the bushing 150 to the –DC layer 70 and the switch conductor 152. In some embodiments, the washer 153 may be omitted, if the head of the bolt 151 has a size sufficient to provide a firm mechanical coupling with the portion of the –DC layer 70 adjacent thereto. When the coupling is assembled, electrical current is conducted from the –DC layer 70 via the washer 153, the bolt 151, and the bushing 150, through a dielectric layer 106, through the +DC layer 74, through the insulator layer 110, and to the switch conductor 152.

The bushing 150 is designed to pass high power (i.e., high voltage and large currents). The bushing 150 has a cylindrical shape with an upper shoulder 162, an upper cylindrical portion 164, and an axial hole 166 provided therein having a size for inserting the bolt 151 therethrough to provide a connection with the switch as illustrated, or for other couplings such as a capacitor. The bushing 150 also includes a flat lower surface 170 for electrically contacting the switch conductor 152. A hole 174 in the conductor 152 is provided to allow passage of the bolt 151 therethrough, so that it can be threaded into a threaded element 175. Therefore, when the bolt 151 is tightened into the threaded element 175, a snug and secure electrical connection is provided between the lower bushing surface 170 and the portion 176 of the switch conductor 152 that adjoins the switch conductor hole 174. The connection is mechanically strong and electrically conductive. The cross section for current flow is very large, which reduces current densities and the possibility of arcing. In one embodiment, a current of at least 325 amps can be conducted through this connection and a voltage of 750–800 V can be held off.

Beginning from the bottom of FIG. 5, the bushing 150 extends through a hole 180 formed in the insulator layer 110 having a shape to conform to the outer surface of the bushing 150. The bushing 150 also extends through an insulator ring 182 positioned in the +DC layer 74. The outer surface of the coupling 150 has a shape for conforming with an inner surface 183 of the insulator ring 182. An outside diameter 184 of the insulator ring 182 is positioned within a hole 186 formed within the +DC layer 74. Above the +DC layer 74, the bushing 150 passes through a dielectric hole 190 formed in the first dielectric layer 106. Above the dielectric layer 106, the bushing's upper cylindrical portion 164 is press-fit within a hole 192 provided in the –DC layer 70 to provide a strong electrical connection.

The bushing 150 is well-insulated from the +DC layer 74 by the insulator ring 182. The insulator ring 182 may be formed of a glass-epoxy material, although any suitable insulator material may be used, such as a fiber or glass-filled resin. The insulator ring 182 need not be a separate ring that is inserted in the conductive layer 108. Instead, the ring 184 could be formed in an injection process within an assembled laminated bus. Specifically, all of the layers through which the passageway section passes are bonded, the holes in the passageways are drilled, and the bushing 150 is inserted and positioned therein. The holes in the passageway are formed so that there is a space between them sufficient for injecting resin. An insulative resin is injected through the space therebetween (a 0.15 inch gap) so that the resin fills the space within the ring 182, thereby insulating the bushing 150. Care must be exercised in choosing the injected material. To avoid failure during operation, the insulator material is preferably not prone to fracturing or cracking: therefore pure resin should be avoided. Preferably, materials such as nylon or teflon should be avoided because they cannot be bonded to the adjacent layer. It is useful to choose a material for the insulator ring 182 that can bond to the first dielectric layer 106 and the insulator layer 110 as well as to the +DC layer 74.

The insulator ring 182 preferably has a thickness that matches the thickness of the +DC layer 74 to within 0.001 inch. It is advantageous to have as close a fit as possible, in order to avoid arcing which could otherwise occur in the seam between the bushing 150 and the +DC layer 74. This electrical coupling has been tested to 3000 V in prototypes without breakdown.

Reference is now made to FIGS. 1, 2, 6A, 6B, 6C, and 6D, to describe the layout of the laminated bus assembly 60 in the one embodiment. Particularly, the following discussion will address the couplings and connections accomplished through the laminated bus assembly 60, including the coupling between the switches, the DC buses, the gate control board, and the capacitor bank. Because layout of the laminated bus assembly is symmetrical and a number of structures are repeated, a discussion of only one of each type of coupling structure is provided.

As discussed above with reference to FIG. 1A, the plurality of switches 20 are arranged in a +DC row that includes the +DC switches 30a–c, and a –DC row that includes the –DC switches 32a–c. The exploded view of FIG. 2 illustrates with dotted lines the passageways that provide various electrical connections between the +DC switches 30a–c, the –DC switches 32a–c, the –DC layer 70, and the +DC layer 74. It can be seen that the layout of the laminated bus assembly 60 is symmetrical along rows defined in the direction indicated by an arrow 390.

Reference is now made to FIG. 6A in conjunction with FIG. 2. As illustrated in FIG. 2, a first passageway 400 provides a passageway for coupling the –DC bus 70 and the –DC switch 32a, which is shown in dotted lines in FIG. 6A. A second passageway 404, shown in FIGS. 2 and 6A, provides a passageway for coupling the –DC switch 32a with the first AC bar conductor 64a. FIG. 6A shows a switched electrical connection from the –DC bus 70, through the –DC switch 32a, and then to the AC bar conductor 64a. This connection includes two couplings: a first coupling in the first passageway 400 between the –DC bus 70 and the –DC switch 32a, and a second coupling in the second passageway 404 between the –DC switch 32a and the first AC bar conductor 64a. The first coupling between the –DC bus 104 and the –DC switch 32a in the first passageway 400 has already been described with reference to FIG. 5. FIG. 6A shows an insulator ring 410 positioned in the first AC bar conductor 64a, in order to allow installation of the bolt 151 while preventing arcing between the bolt 151 and the first AC bar conductor 64*a*. A hole is formed in the first dielectric layer 102 and the top plastic layer 120*a*, having a size sufficient to access the bolt 151.

As discussed previously with reference to FIG. 1A, a gate control bus 18*d* supplies control signals to the −DC switch 32*a*. The gate control bus 18*d* passes through the laminated bus assembly 60 via a third passageway 420 (FIG. 2) provided therein. The third passageway 420 includes an insulator ring 422 in the +DC layer 74, and a second insulator ring 424 positioned in the −DC layer 70. The gate control bus 18*d*, in the illustrated embodiment, does not require an insulator between it and the AC bar conductor 64*a*. In other embodiments, a third insulator ring could be utilized to pass the gate control bus 18*d* through the AC bar conductor 64*a*.

FIG. 6A shows the coupling through the second passageway 404 including a bolt 430, a washer 432, and a bushing 434 having a hole for passage of the bolt 430. The bushing 434 is electrically coupled with the conductor 436 of the −DC switch 32*a*. Therefore, an electrical connection is provided between the first AC conductor 64*a* and the second switch conductor 436. The coupling through the passageway 404 also includes a first insulator ring 440 positioned in the −DC layer 70 and a second insulator ring 442 positioned in the +DC layer 74. Principles of the couplings and rings, and their construction are described with reference to FIG. 5. It should be apparent that the couplings described above are repeated for the −DC switches 32*b* and 32*c*.

Reference is now made to FIG. 6B which illustrates a switched electrical connection between the +DC layer 74, through the +DC switch 30*a*, and to the first AC bar conductor 64*a*. Particularly, the +DC layer 74 is coupled to the +DC switch 30*a* through a first +DC passageway 460. The first +DC switch 30*a* is coupled with the first AC bar conductor 64*a* via a second +DC passageway 464. A bolt 466 (also illustrated in FIG. 1A) and a bushing 467 couple the +DC layer 108 with the +AC switch 30*a*. A bolt 470, a washer 471, and a bushing 472 (also illustrated in FIG. 1A) is utilized to couple the first AC bar conductor 64*a* to the first AC switch 30*a*. In many respects, the method and apparatus for coupling is similar to that described with reference to FIG. 6A, and FIG. 5 above, except that the size and position of the elements are adapted suitably. Particularly, the bushing, the coupling and its structure, and other features are repeated therein, and will not be described separately in detail. The coupling described in FIG. 6B is repeated for the second +DC switch 30*b* and the third +DC switch 30*c*.

Reference is briefly made to FIG. 2. To provide control signals on the first gate bus 18*a* from the gate control board 14 to the +DC switch 30*a*, a passageway 480 is provided therein. The passageway 480 includes insulator rings in each of the conductive layers, including a first insulator ring 482 in the −DC layer 70 and a second insulator ring 484 in the +DC layer 74.

Reference is now made to FIG. 6C which illustrates the electrical connection between the midpoint bus 67, the dielectric capacitors 82, and the +DC layer 74. As discussed above, the layout of the laminated bus assembly 60 is symmetrical along rows defined in the direction of the arrow 390. As illustrated on the midpoint bus 67 of FIGS. 1A and 1B, the capacitors have three row designations. The first designation "A" designates rows that are coupled to the midpoint bus 67. The rows designated "C" are coupled to the +DC bus 74. The rows designated "B" are coupled to the −DC bus 70. The capacitors are paired in one of two ways: A-to-C or A-to-B. Each respective pair of capacitor connections couples with one of the sixteen capacitors 82 shown in FIG. 1B. Of course, in other embodiments, a different number of capacitors could be utilized, dependent upon capacitor ratings and design requirements, among others. For purposes of illustration, only two of the connective pairs will be shown. However, it will be apparent that for each row, the corrections are repeated.

In FIG. 6C, the A-to-C connection is shown. The "C" connection is illustrated by a passageway 500 (also shown in FIG. 2). The "C" connection includes a bolt 502 that couples a bushing 506 with one of the capacitors 82 which has a threaded coupling 508 to receive the bolt 502. Each capacitor 82 has a pair of threaded couplings to receive their respective connecting bolts. In the "C" passageway 500, an insulator ring 510 is positioned in the −DC layer 70 in order to allow passage of the bushing 506, and a second insulator ring 514 is positioned in the midpoint bus 67 in order to allow passage of the bushing 506.

The "A" row, as illustrated in a passageway 520 (also shown in FIG. 2) provides an electrical connection between the midpoint bus 67 and one of the capacitors 82. A bolt 522 and a washer 523 are provided to couple a bushing 526 with a threaded portion 528 of the capacitor 82.

FIG. 6D shows the A-to-B electrical connections. The "A" connection is shown on a line 542 (also shown in FIG. 2). The "A" connection connects the midpoint bus 67 with a capacitor 82. The "A" connection is similar to the "A" connection along the line 520 described above with reference to FIG. C. The "B" connection, illustrated in a passageway 560, electrically connects the −DC layer 70 with a capacitor 82. The "B" connection includes a bolt 562, a washer 563, and a bushing 566. The bolt 562 is coupled to a threaded portion 568 of one of the capacitors 82.

The principles of the couplings within all passageways 500, 520, 540, and 560 are similar to that described with reference to FIG. 5, and the structures such as the insulator rings, bolts, and the coupling are similar thereto.

The foregoing discussion and particularly FIGS. 1A, 1B, and 2 describe only one layout, and other layout configurations could be utilized. In the layout of FIGS. 1A, 1B, and 2 the low inductance afforded by the laminated arrangement is minimized further by closely positioning the switches 30*a*–*c* and 32*a*–*c* to minimize the length of the current conducting sections within the laminated assembly. Of course, one advantage of reduced inductance is that voltage overshoot during switching is reduced. However, at high power, closely positioning the switches results in dense thermal flux which must be dissipated. For such high power embodiments, expensive cooling methods may be required to dissipate the thermal energy produced. For such high power applications, it would be useful to provide a layout that reduces thermal density so that less expensive cooling methods can be used.

FIGS. 7A and 7B show one implementation of a laminated bus assembly that spreads the switches to reduced thermal density in a compact package. This implementation allows greater separation between each of the switches, to provide better heat dissipation for each switch and thereby to enhance reliability and increase useful life of the components. Furthermore, the configuration efficiently utilizes space, thereby reducing size and cost. The increased inductance caused by spreading the switches (i.e. lengthing the section of current flow) is reduced in this implementation by making the dielectric layers thinner (0.015 inch).

The laminated bus assembly of FIGS. 7A and 7B includes a surface layer 700, a −DC layer 702, and a +DC layer 704 to implement the circuit of FIG. 4. From a circuit perspective, the −DC layer 702 and the +DC layer 704 of FIG. 7B function identically with the corresponding layers in FIG. 1A (i.e. the −DC layer 70 and the +DC layer 74). Their layout configurations (i.e., the configuration of the holes and connections) can be easily determined by their position with respect to the buses on the surface layer 700, as will be apparent to one skilled in the art, and also with reference to FIGS. 1A, 1B, and 2.

In FIGS. 7A and 7B, the surface layer 700 includes AC layers 714*a–c* configured differently from FIGS. 1A, 1B, and 2. Two midpoint buses 720*a–b* are positioned between the AC layer 714*a–c*. Particularly, a first midpoint bus 720*a* is positioned between a first AC layer 714*a* and a second AC layer 714*b*. A second midpoint bus 720*b* is positioned between the second AC layer 714*b* and a third AC layer 714*c*. The first AC layer 714*a* is connected to a switch pair 730*a* for the first of the three AC phases. The second AC layer 714*b* is connected to a switch pair 730*b* for the second AC phase, and the third AC layer 714*c* is connected to a switch pair 730*c* for the third AC phase. Positioning the midpoint buses 720*a–c* between the AC layers 714*a–c* allows greater separation between the first switch pair 730*a*, the second switch pair 730*b*, and the third switch pair 730*c*, than the configuration disclosed in FIGS. 1A and 1B.

A plurality of the capacitors, such as a capacitor 732, are coupled between the midpoint buses 720*a–b* and the −DC layer 702 and the +DC layer 704 in accordance with the circuit diagram of FIG. 4 and the discussion of the capacitors with reference to FIGS. 6C and 6D. The midpoint buses 720*a–b* designate the position of capacitors. Particularly, the connections designated by "A" couple the midpoint buses 720*a–c* to the capacitors. The holes designated by "B" couple the −DC layer 702 to the capacitors, and the "C" connections couple the +DC layer 704 to the capacitors.

The switches 730*a–c* are coupled to a gate control bus 734 that corresponds to the gate control bus 14 of FIGS. 1A and 1B. The gate control bus 734 controls the switches 730*a–c* in accordance with pulse-width modulation signals provided from a suitable source. One example is that described in U.S. Pat. No. 5,369,353, dated Dec. 8, 1992, by William L. Erdman, entitled "A Controlled Electrical Energy Storage Apparatus for Utility Grids", and Ser. No. 08/212,511, dated Mar. 11, 1994, by William L. Erdman, entitled "Active Filter for a Power Converter".

In order to increase heat dissipation, the switches 730*a–c* are connected to a heat conductive base 740, which is coupled to a heat sink 742 that includes a plurality of heat fins 744. Furthermore, a housing 750 is outfitted with a fan 752 to enhance cooling of the switches 730*a–c* and the entire laminated bus assembly.

From the above description, it will be apparent that the invention disclosed herein provides a novel and advantageous coupler and a laminated, high power bus structure for a converter. The foregoing discussion discloses and describes exemplary methods and embodiments of the present invention. As will be understood by those familiar with the art, the invention may be embodied in other specific forms without departing from its spirit or essential characteristics, and thus, the described embodiment is not restrictive of the scope of the invention. The following claims are indicative of the scope of the invention. All variations which come within the meaning and range of equivalency of the claims are to be embraced within their scope.

What is claimed is:

1. An apparatus comprising:

an electrical device;

a laminated bus assembly that includes first conductive layer, a second conductive layer, and a first dielectric layer positioned intermediate between the first conductor layer and the second conductor layer;

a device coupler for electrically coupling the electrical device to the laminated bus assembly, the device coupler comprising
 a coupling engagement hole defined in said first conductive layer;
 a passage hole defined in said second conductive layer, and an insulator ring formed around said passage hole;
 a bushing comprising a conductive material, said bushing including
  an engageable section having a shape for engaging with said coupling engagement hole, and
  a passage section having a shape for passing through said passage hole; and
 a fastener for mechanically and electrically coupling said bushing, said first conductive layer, and said electrical device.

2. The apparatus of claim 1 wherein said bushing includes an electrically conductive shoulder formed proximate to said engageable section to electrically connect with said first conductive layer.

3. An apparatus comprising:

an electrical device;

a laminated bus assembly that includes a plurality of conductive layers including a first conductive layer, a second conductive layer, and a third conductive layer, a first dielectric layer positioned intermediate between the first conductive layer and the second conductive layer, a second dielectric layer positioned intermediate between said second conductive layer and said third conductive layer, and an insulator layer positioned between said third conductive layer and said electrical device;

a device coupler for electrically coupling the electrical device to the laminated bus assembly, said device coupler comprising
 a bolt having a head and a threaded portion;
 a threaded receptacle in said electrical device for receiving said threaded portion of said bolt;
 a coupling engagement hole defined in said first conductive layer;
 a passage hole defined in said second conductive layer and an insulator ring formed around said passage hole; and
 a bushing comprising a conductive material, said bushing defining a bolt passage hole for passage of said bolt, said bushing also including
  an engageable section having a shape for engaging with said coupling engagement hole, and
  a passage section having a shape for passing through said passage hole;
 so that when said bolt is tightened into the threaded receptacle, electrical connections are formed between said engageable section in said bushing and said coupling engagement hole, between said shoulder in said first one conductive layer and an adjacent portion of said conductive layer, and between said device contact section on said bushing and said threaded receptacle.

4. The apparatus of claim 3 wherein said bushing comprises:

an electrically conductive shoulder formed between said engageable section and said passage section; and a device contact area for electrically contacting said device conductor.

5. A laminated bus assembly including a coupling mechanism for electrically coupling an electrical device to a low impedance laminated bus assembly in a high power switching converter that includes a plurality of switch pairs each including a +DC switch and a −DC switch to convert between AC power on an AC power line that has a plurality of phases and DC power from a DC device, said laminated bus assembly comprising:

a first plane having a plurality of AC bar conductors positioned therein, including an AC bar conductor for each phase of AC power;

a second plane including a −DC bar conductor;

a third plane including a +DC bar conductor;

a plurality of dielectric layers laminated between the first, second, and third planes;

a −DC coupler for coupling the −DC bar conductor to each −DC switch, including a first conductive bushing;

a +DC coupler for coupling the +DC bar conductor to each +DC switch, including a second conductive bushing;

a +AC switch coupler for coupling each +AC bar conductor to each +DC switch, including a first plurality of conductive bushings; and a −AC switch coupler for coupling each −AC bar conductor to each −DC switch, including a second plurality of conductive bushings.

6. The laminated bus assembly of claim 5 further comprising a midpoint bus for coupling a plurality of capacitors said capacitors having a first and a second connection, said capacitors arranged in a first row of capacitors having their first connections coupled to the +DC bar conductor, and a second row of capacitors having their first connections coupled to the −DC bar conductor, and the capacitors in both said first and second rows having their second connections coupled to the midpoint bus.

7. The laminated bus assembly of claim 5 further comprising:

a first midpoint bus coupled between a first and a second of said AC bar conductors; and a second midpoint bus coupled between said second and third of said AC bar conductors.

* * * * *